(12) United States Patent
Tsironis

(10) Patent No.: US 9,267,977 B1
(45) Date of Patent: Feb. 23, 2016

(54) METHOD FOR MAXIMIZING THE REFLECTION FACTOR OF IMPEDANCE TUNERS

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 208 days.

(21) Appl. No.: 13/793,523

(22) Filed: Mar. 11, 2013

Related U.S. Application Data

(63) Continuation of application No. 13/238,050, filed on Sep. 21, 2011, now Pat. No. 8,427,255.

(51) Int. Cl.
*G01R 27/04* (2006.01)
*G01R 27/32* (2006.01)
*H03H 7/38* (2006.01)

(52) U.S. Cl.
CPC ..................... *G01R 27/32* (2013.01)

(58) Field of Classification Search
CPC ...... G01R 27/2605; G01R 27/26; H03H 7/40; H03H 7/38; G01N 22/00; G01N 21/3581
USPC ................ 324/629, 437, 445, 446, 754.01, 324/754.03, 755.11, 690, 696, 750.17, 324/754.28, 658, 686, 637, 642; 333/17.3, 333/263
See application file for complete search history.

(56) References Cited

U.S. PATENT DOCUMENTS

| | | | |
|---|---|---|---|
| 6,674,293 B1 | 1/2004 | Tsironis | |
| 6,850,076 B2 | 2/2005 | Tsironis | |
| 6,980,064 B1 * | 12/2005 | Boulerne | H01P 5/04 324/637 |
| 7,053,628 B1 | 5/2006 | Tsironis | |
| 7,135,941 B1 * | 11/2006 | Tsironis | H01P 5/04 324/642 |
| 7,282,926 B1 * | 10/2007 | Verspecht | H01P 5/04 324/637 |
| 8,410,862 B1 | 4/2013 | Tsironis | |
| 2004/0119481 A1 * | 6/2004 | Tsironis | G01R 27/32 324/637 |
| 2007/0052505 A1 * | 3/2007 | Simpson | H01P 1/127 333/263 |
| 2007/0171008 A1 * | 7/2007 | Boulerne | 333/263 |

OTHER PUBLICATIONS

"Prematching tuners for very high VSWR and power load pull measurements," Product Note 52, Focus Microwaves Inc., Mar. 1999, www.focus-microwaves.com.
"Three probe tuners tackles multiple tasks," Microwaves & RF Magazine, Feb. 2005, p. 90.

* cited by examiner

*Primary Examiner* — Patrick Assouad
*Assistant Examiner* — Taqi Nasir

(57) ABSTRACT

An automatic microwave load pull slide screw tuner uses two RF probes, either independently movable or linked together, in order to generate high VSWR; precise alignment of two RF probes inside the same slabline is critical, since they must glide seamlessly inside the slabline slot, very closely to the center conductor over large horizontal displacements; a self-alignment mounting joint for the probes is described, which allows one or both of them to be mounted on the tuner's vertical axis held by a flexible steel blade, which allows sidewise movement and tilting and self-alignment of the probe, but also ensures unyielding movement in vertical and horizontal directions, as required for exact re-positioning of the probe during measurement. In case of double probes mounted on the same tuner axis the steel blade provides for a number of probe spacings, which allow the frequency range of the tuner to be switched for various applications.

5 Claims, 22 Drawing Sheets

Flexible, self aligning assembly for double probe slide screw tuners with a low and a high frequency probe and frequency band switching capability FIGURE 1: Prior art, typical automated load pull test setup FIGURE 2: Prior art, cross section of slide screw tuner with a single vertical axis and probe FIGURE 3: Prior art, cross section of perfectly aligned slide screw tuner FIGURE 4: Prior art, cross section of slide screw tuner with two independent probes and vertical axis FIGURE 5: Prior art, cross section of slide screw tuner with two linked and synchronous vertical axis and probes FIGURE 6: Prior art, cross section of slide screw tuner with a single vertical axis and double probe FIGURE 7: Prior art, frequency response of single probe and ideally aligned double probe tuners FIGURE 8: Prior art, frequency response of load pull tuner using optimally aligned single probe FIGURE 9: Prior art: Possible misalignment of RF probes in slide screw tuners: a) Tilted tuner axis or Probe holding pin; b) Shifted tuner axis FIGURE 10: Prior art: typical frequency response of misaligned tuner probe FIGURE 11: Ideally aligned probes in a slide screw tuner using two probes, independent or linked together FIGURE 12: Prior art, typical frequency response of perfectly aligned versus misaligned two probe tuner FIGURE 13: View of RF probe mounted inside a slabline using a vertical flexible steel blade. a) cross section, b) side cross view FIGURE 15: Side view section of two probe tuners, one with fixed mounting and one with flexible mounting FIGURE 17: Side view section of two probe tuner, where both probes are mounted using flexible steel blade joints

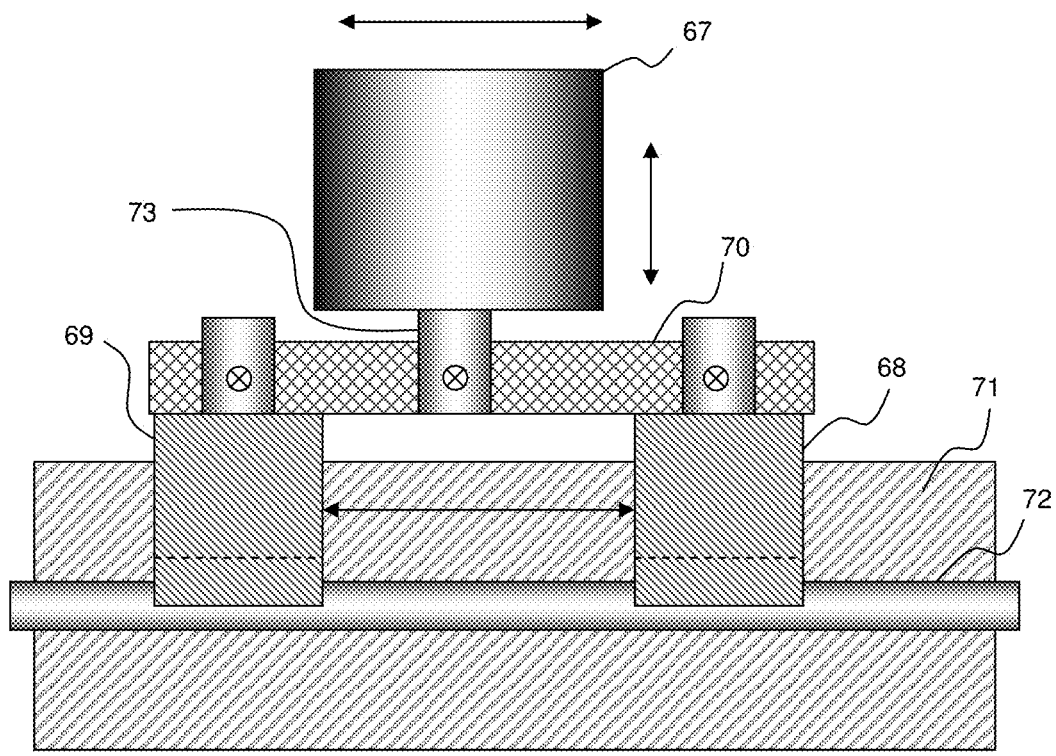
FIGURE 19: Flexible self aligning assembly of double probe tuner

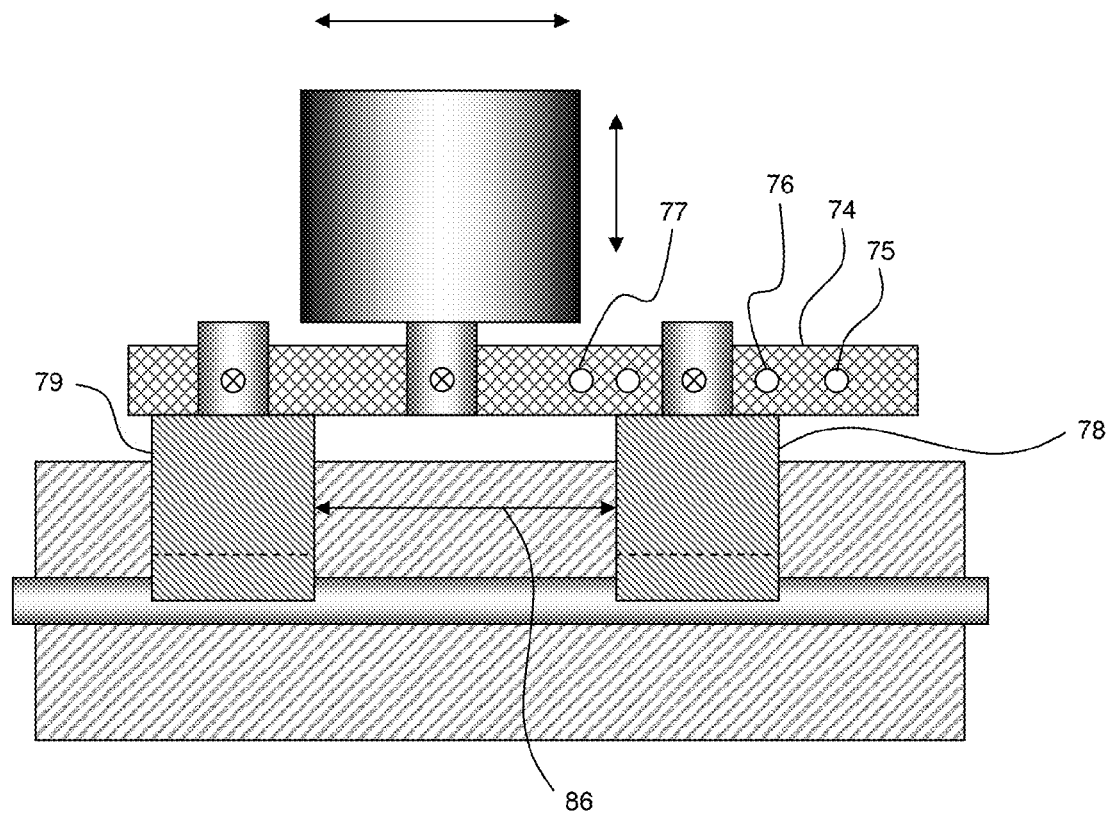
FIGURE 20: Flexible, self aligning assembly for double probe slide screw tuners with frequency band switching capability

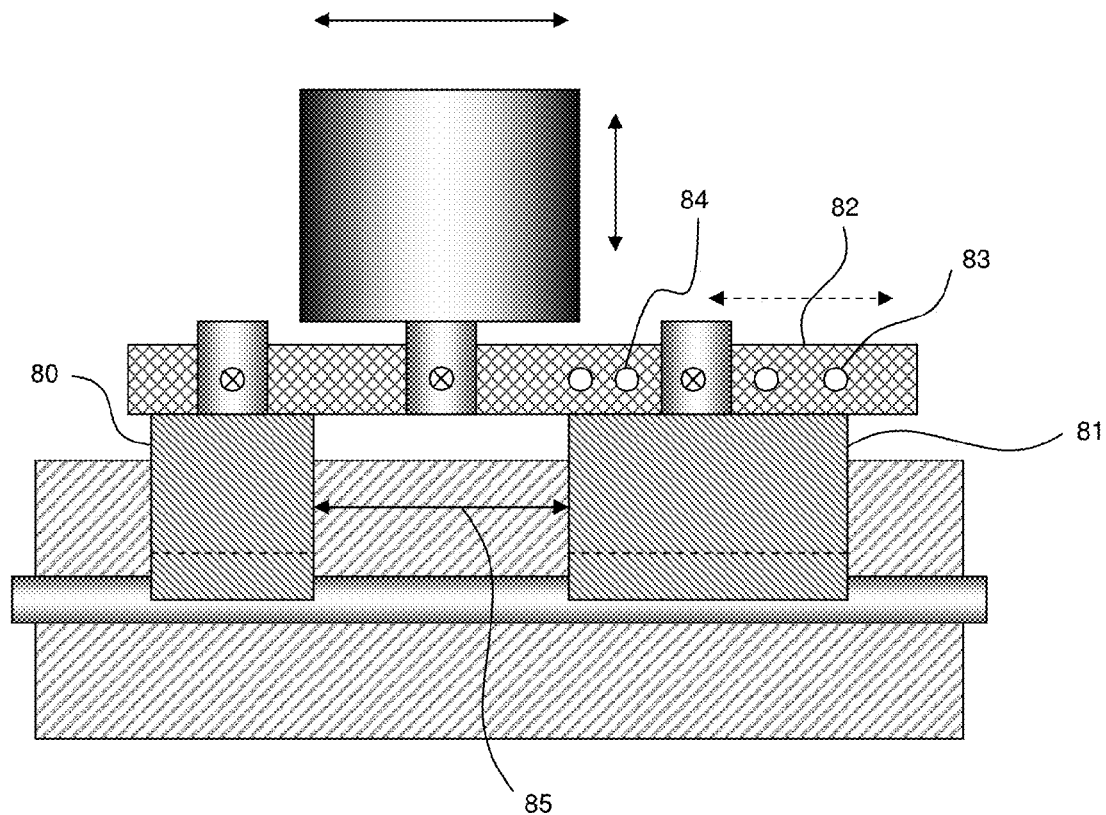
FIGURE 21: Flexible, self aligning assembly for double probe slide screw tuners with a low and a high frequency probe and frequency band switching capability

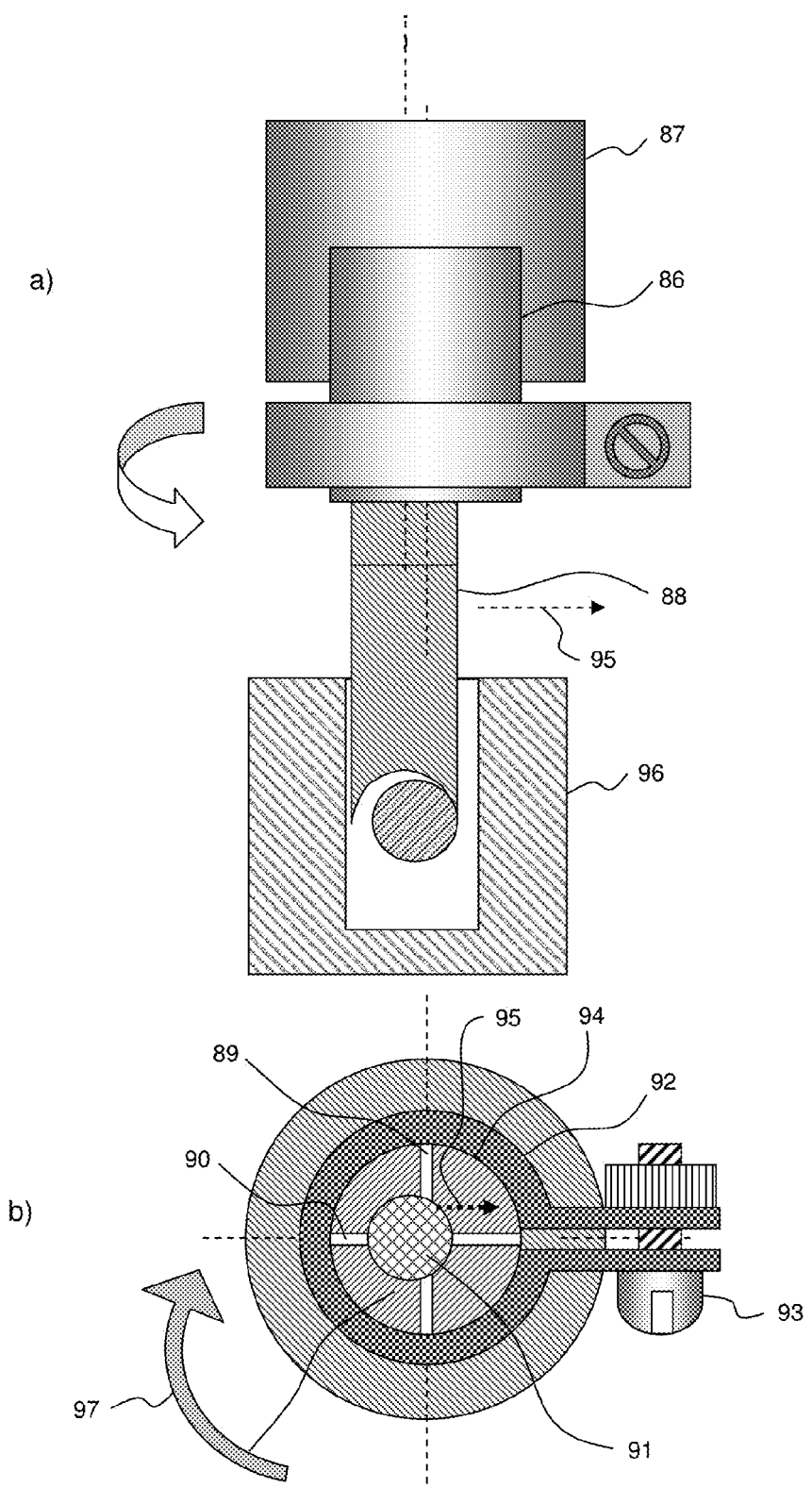
FIGURE 22: Probe holder with intermediate mounting ring, allowing lateral adjustment of the probe

METHOD FOR MAXIMIZING THE REFLECTION FACTOR OF IMPEDANCE TUNERS

CROSS REFERENCE

This application is a continuation of U.S. Non-Provisional patent application Ser. No. 13/238,050 filed Sep. 21, 2011 and titled LOAD PULL TUNER WITH ADJUSTABLE SINGLE AND DOUBLE PROBES, which is incorporated herein by reference in its entirety.

PRIORITY CLAIM

Not Applicable

CROSS-REFERENCE TO RELATED ARTICLES

[1] U.S. Pat. No. 6,674,293: Adaptable pre-matched tuner system and method.
[2] U.S. Pat. No. 6,850,076: Microwave tuners for wideband high reflection applications.
[3] U.S. Pat. No. 6,980,064: Slide-screw tuner with single corrugated slug.
[4] U.S. Pat. No. 7,053,628: High reflection microwave tuner using metal-dielectric probe and method.
[5] Product Note 52, "Prematching tuners for very high VSWR and power load pull measurements"; Focus Microwaves, March 1999.
[6] "Three probe tuners tackles multiple tasks", Microwaves & RF Magazine, February 2005, page 90ff

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of microwave power transistors using automatic microwave tuners for synthesizing reflection factors (or impedances) and match the transistors (device under test, or DUT) at the input and output at the fundamental and harmonic frequencies.

Modern design of high power microwave amplifiers, oscillators and other active components used in various communication systems requires accurate knowledge of the active device's (microwave transistor's) characteristics. In such circuits, it is insufficient and inaccurate for the transistors operating at high power in their highly nonlinear regions and close to saturation, to be described using analytical or numerical models only. Instead the devices must be characterized using specialized test setups under the actual operating conditions.

A popular method for testing and characterizing transistors for high power operation is "load pull" and "source pull". Load pull or source pull are measurement techniques employing microwave tuners 2, 4 and other microwave test equipment, like a signal source 1, an RF (Radio Frequency) load 5, control computer 6 and digital connections 7, 8, 9 between the computer and the tuners and test equipment. The microwave tuners 2, 4 in particular are used in order to manipulate the RF impedance conditions under which the Device under Test 3 (transistor or DUT), is tested (FIG. 1).

Electro-mechanical tuners [3] are used in most cases for high power load pull testing, because they have several advantages, such as long-term stability, higher handling of RF power, easier operation and lower cost, compared to other type of tuners such as electronic and active tuners.

FIG. 2 shows a front view and cross section of an automatic electro-mechanical tuner using the "slide-screw" tuning concept; a slotted airline (slabline) 15, with two RF connectors 25, 26 at both ends is embedded in a solid housing 16, which also comprises a mobile carriage 18 and means for horizontal drive, typically a lead screw 17; said carriage slides smoothly on polished and grounded shafts 19. The carriage 18 comprises a stepper motor 20, which is powered by a control computer 20a running appropriate software and controls the movement of a precise vertical axis 21. At the bottom end of the axis 22 an appropriate clamp 22a holds the holding pin of the RF probe 23 and secures its exact and repeatable positioning very close to the central conductor 24 of the slabline 15. Moving the probe 23 closer to the central conductor 24 increases the amplitude of the reflection factor, and moving it along the axis of the slabline 15 controls its phase.

A cross section of the 'slide screw' tuning mechanism is shown in FIG. 3; in this configuration adjustable metallic obstacles (probes or "slugs") 10 are inserted into the transmission media of the tuners, which is a slotted coaxial or parallel plate airline (slabline) 11; the capacitive coupling between the vertical probe 10 and the central conductor 12 of the slotted airline (slabline) creates a wideband RF reflection factor ($\Gamma$), of which the amplitude can be adjusted by inserting the probe 10 further into the slabline and modifying the gap between the probe 10 and the central conductor 12 and therefore changing the value of the capacitance between the central conductor 12 and the probe 10.

The probe 10 is held and guided by the vertical axis 13 of the tuner and is moved vertically 14 by the axis 13, which is driven by a vertical lead screw and computer controlled stepper motors, known in prior art [4, FIG. 3] (FIGS. 2, 3).

High power RF transistors (DUT), for which, due to lack of adequate nonlinear numeric models, load pull testing is a very important characterization method, have very low internal RF impedance $R_{min}$ of the order of 1 to $2\Omega$ and sometimes below; the tuners used for load pull testing need to physically match the internal impedance of the transistors, meaning that they must be able to generate such low impedances in a measurement system with typically $50\Omega$ characteristic impedance. This means in many cases the tuners must be able to generate RF reflection factors ($\Gamma$) between 0.92 and 0.98 or a Voltage Standing Wave Ratio (VSWR) between 24:1 and 99:1;

The following simple relations are used: VSWR= $(1+\Gamma)/(1-\Gamma)$, $R_{min}=50\Omega/VSWR$. A reflection factor of $\Gamma=1.0$ corresponds to a short circuit or $R_{min}=0$, and no power at all is transferred from the DUT to the load. Ordinary single probe tuners can generate typical VSWR values of the order of 20:1 or less ($\Gamma=0.905$ or smaller).

DESCRIPTION OF PRIOR ART

Tuners generating VSWR high enough (typically VSWR>100:1) to match very low impedance transistors, often use the "independent two-probe" or "pre-matching" concept [1] (FIG. 4). In these tuners the first probe 27 tunes in the general area of the DUT conjugate complex impedance and the second probe 28 tunes around it to determine the optimum matching conditions. Such tuners can create VSWR up to 200:1 depending on the frequency range and internal loss of components (slablines, adapters) used [5];

Another method used in tuners in order to generate high VSWR employs the "electro-mechanically linked two-probe" concept [2] (FIG. 5). In this case there is a master carriage 29, which is driven by the lead screw 30b and a slave carriage 30, which is not driven (30a) by the lead screw 30b; both carriages holding the two probes 31 and 32 are linked together mechanically 33, in a manner allowing their horizontal distance to be adjusted manually and fixed for the entire test session, and they are driven electrically to move vertically in unison; therefore those tuners allow the two probes to move both horizontally and vertically synchronously. This creates a form of wideband resonance with high VSWR and tuning patterns different than the "two independent probe (pre-matching)" configuration [1]; tuners with two linked probes cover the whole Smith Chart homogenously [2]. These tuners are cheaper to manufacture than the twin independent probe tuners in what they require only a single horizontal motor and drive.

A third possibility is to use a further simplified version of the "electro-mechanically two-linked-probes" concept by using a single carriage and double probes, i.e. two (or more) probes 34 mounted on the same vertical axis 35 [3] (FIG. 6). This configuration uses only one horizontal 36 and one vertical 37 drive mechanism and is therefore even cheaper to manufacture (FIG. 4); however the fact that the horizontal distance 38 between probes cannot be changed limits the utility of the tuner to a certain frequency range, since linked slugs create fixed multiple reflection frequency response (FIG. 7).

A common problem with extracting superior performance from slide screw tuners is the accurate positioning of the probes inside the slotted airline (slabline). If a probe is positioned exactly as shown in FIG. 3 across the whole length of the slabline, then the required performance as shown in FIG. 8 is achieved.

In the case of a single probe, precise alignment is possible, though tedious, by slightly moving and rotating the slabline in its anchors compared with the vertical axis of the tuner holding the probe. This makes it possible to accurately adjust the mutual positioning between one probe and the slabline. However, even in the case of a single probe, manufacturing tolerances in straightness of the slabline channel often cause difficulties in aligning a tuner over its full length.

When two (or more) probes are used inside the same slabline (FIGS. 4, 5, 6), alignment becomes much more difficult. The difficulty comes from manufacturing and assembly tolerances in the order of a few thousands of a inch. For this reason a typically used, rigid attachment between vertical tuner axis and probe needs improvement.

Probe misalignment can be either by tilted vertical axis (FIG. 9a) or lateral shifting of either the axis or the slabline (FIG. 9b); in both cases the ideal frequency response of a single probe (FIG. 8) is distorted by spurious resonance-type responses as shown in FIG. 10; a tuner with a frequency response as in FIG. 10 is useless. This phenomenon is typical in misaligned tuners and must be eliminated.

The objective is to obtain two (or more) probes 39, 41 inside the same slabline 40 perfectly aligned as shown in FIG. 11a, b. In this case the response of a two probe tuner will be as shown in FIG. 7, whereas, if one or both probes is misaligned, as shown in FIG. 9, then the frequency response of the tuner will be flawed as shown in FIG. 12.

This invention describes a joint between probe(s) and tuner axis, which allows precise positioning where it matters, that is minimum vertical and horizontal movement play, but allows sidewise movement and tilting of the probe(s), in order to be able to compensate for manufacturing tolerances in slabline straightness and vertical axis positioning and tilting.

BRIEF DESCRIPTION OF THE SEVERAL VIEWS OF THE DRAWINGS

The invention and its mode of operation will be more clearly understood from the following detailed description when read with the appended drawings in which:

FIG. 19 depicts a flexible self aligning assembly of two probe tuner.

FIG. 20 depicts a flexible, self aligning assembly for double probe slide screw tuners with frequency band switching capability.

FIG. 21 depicts a flexible, self aligning assembly for double probe slide screw tuners with a low and a high frequency probe and frequency band switching capability.

FIG. 22 depicts a probe holder with intermediate mounting ring, allowing lateral adjustment of the probe.

DETAILED DESCRIPTION OF THE INVENTION

Figure 10:
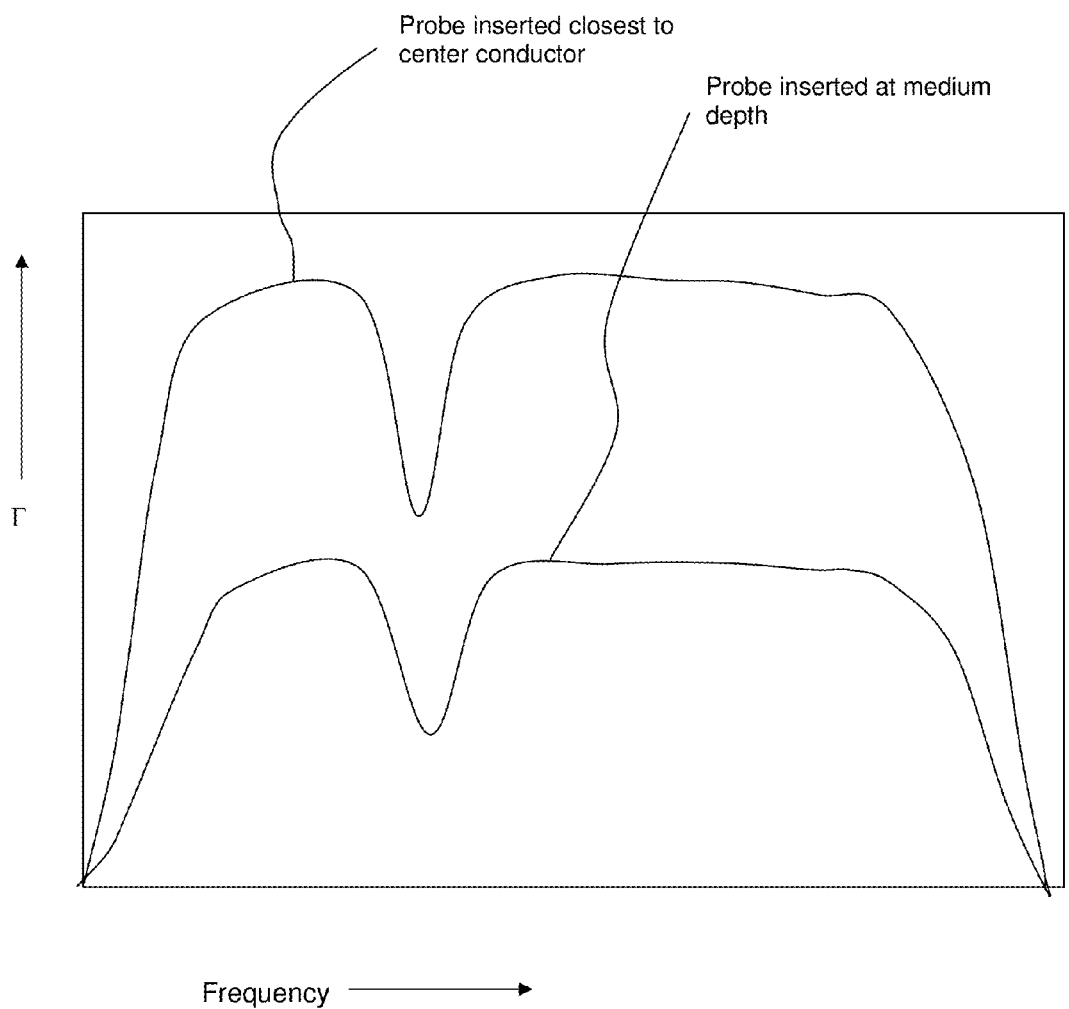
FIG. 10 depicts prior art, a typical frequency response of misaligned tuner probe.
Figure 11:
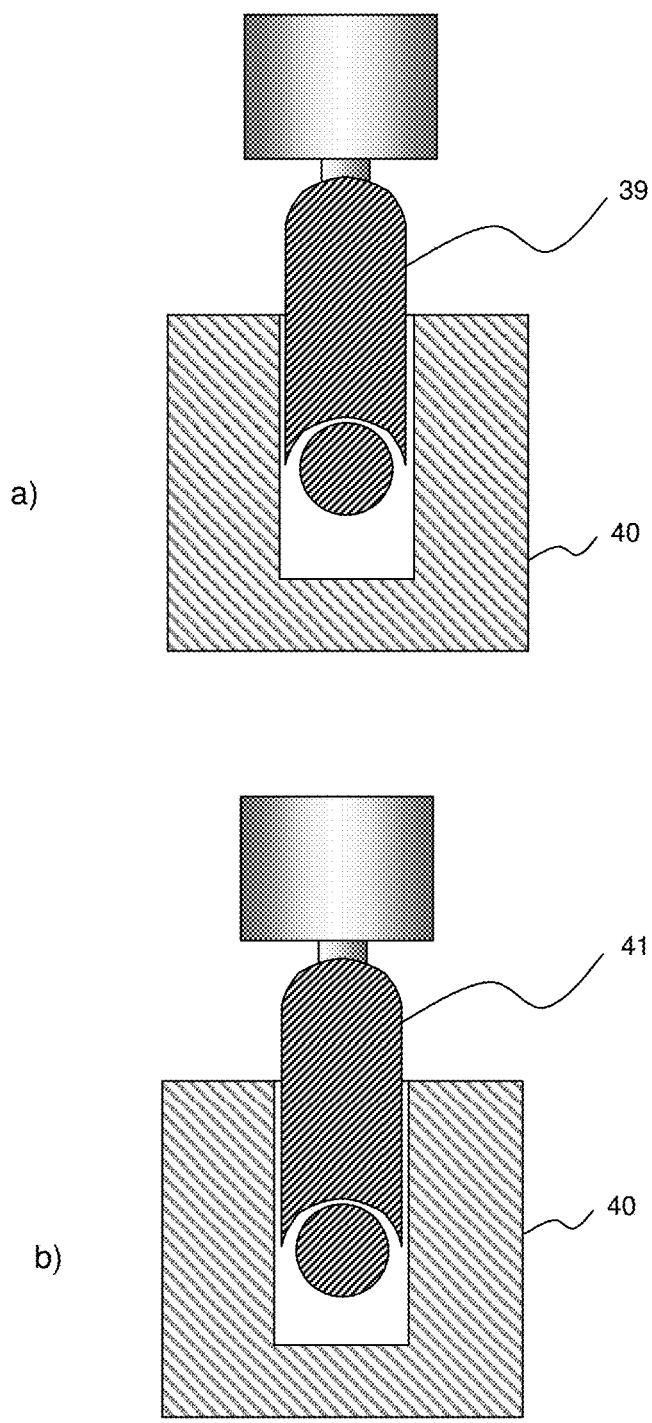
FIG. 11 depicts ideally aligned probes in a slide screw tuner using two independent or linked together probes.
Figure 12:
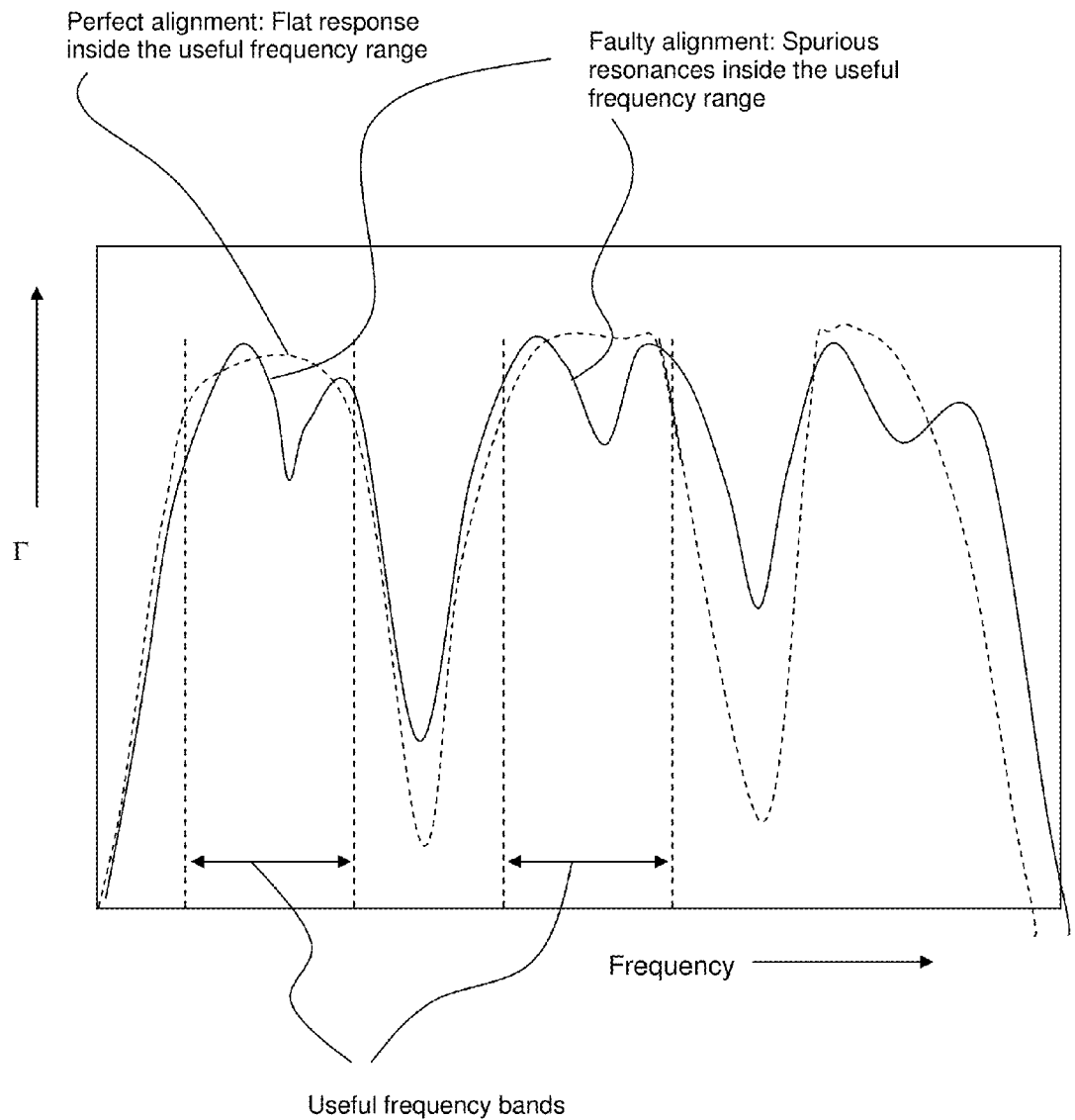
FIG. 12 depicts prior art, typical frequency response of perfectly aligned versus misaligned two probe tuner.

Both, in single probe and in multiple probe slide screw tuners, probe (slug) alignment remains a major issue. In particular when "contacting" probes are used, i.e. probes which touch the lateral walls of the slabline in order to establish firm and continuous RF ground contact. In these cases minor misalignments due to unavoidable manufacturing tolerances will lead to spurious resonances in the tuner response (FIG. 10). This behavior renders the tuner useless and must be avoided at all costs.

The challenge is to make a flexible joint between the rigid vertical tuner axis and the probe, which will allow the probe to do two things at once: a) Follow the shape of the slabline and align itself inside the slabline and b) compensate for shifting or tilting of the tuner axis; at the same time, however, the probe shall not have any slack or backlash in either critical direction, i.e. when the probe is inserted in or lifted out of the slabline, or when it is pushed along the axis of the slabline. The probe must move up and down inside the slabline without backlash (not losing "steps") and without losing the exact vertical position, which may happen if the probe tilts vertically.

The same challenges are for horizontal movement: the probe must move back and forth and regain the exact horizontal position, within micrometers; this means the link to be used shall not allow any tilting of the probe when moving horizontally.

Figure 9:
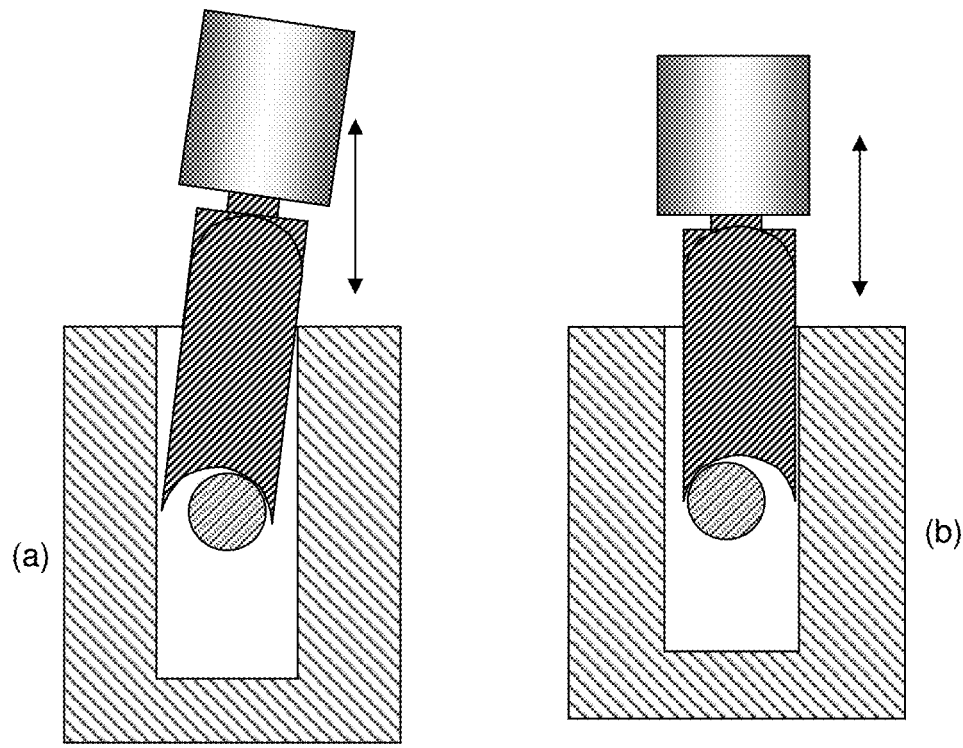
FIG. 9 depicts prior art, possible misalignment of RF probes in slide screw tuners: a) Tilted tuner axis or Probe holding pin; b) Shifted tuner axis.

At the same time the probe must be able to tilt sideways in order to compensate for axis misalignment (FIG. 9a) and be able to turn slightly and compensate for slabline mis-orientation, non-perfect slabline straightness and vertical axis shifting (FIG. 9b).

Figure 13:
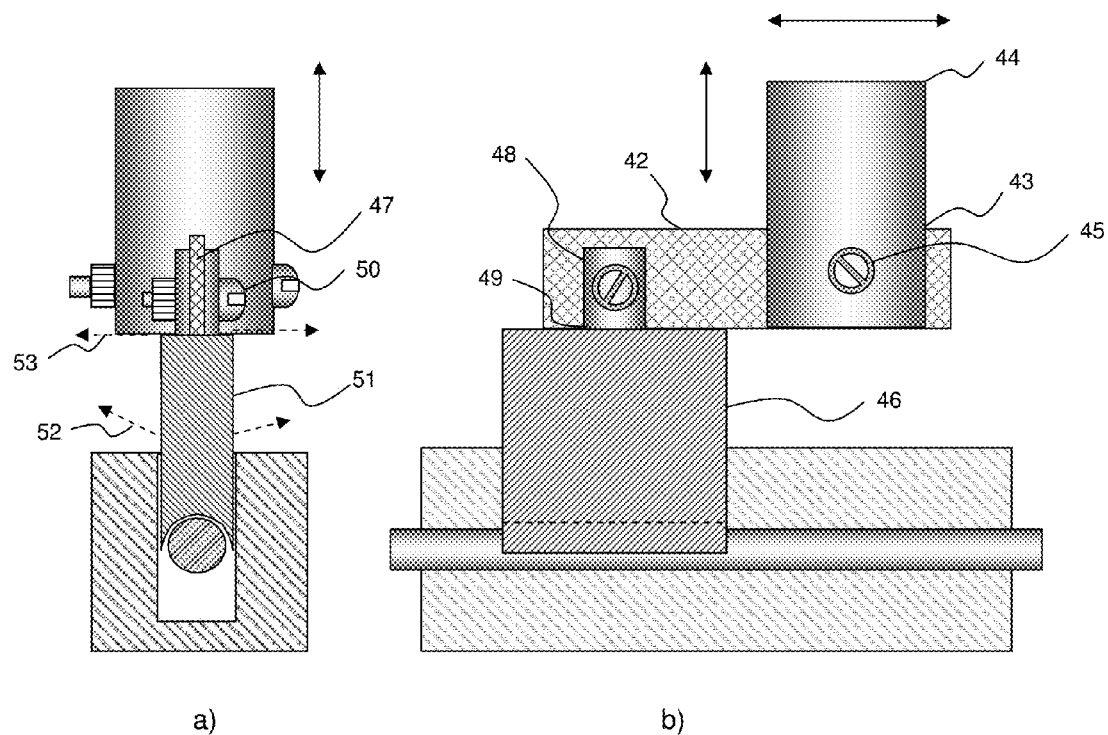
FIG. 13 depicts a view of RF probe mounted inside a slabline using a vertical flexible steel blade.
Figure 14:
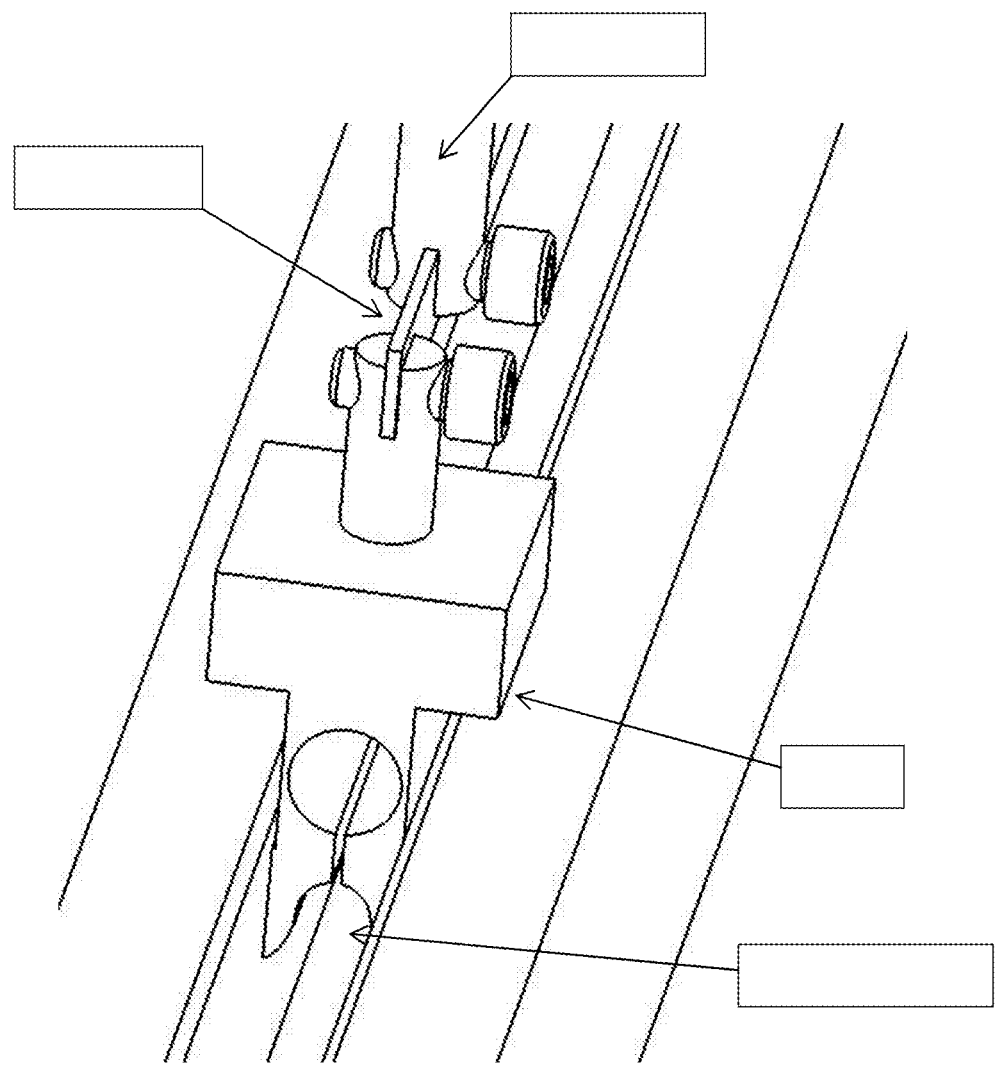
FIG. 14 depicts an actual view of self aligning RF probe mounted inside a slabline using a flexible steel blade.
Figure 16:
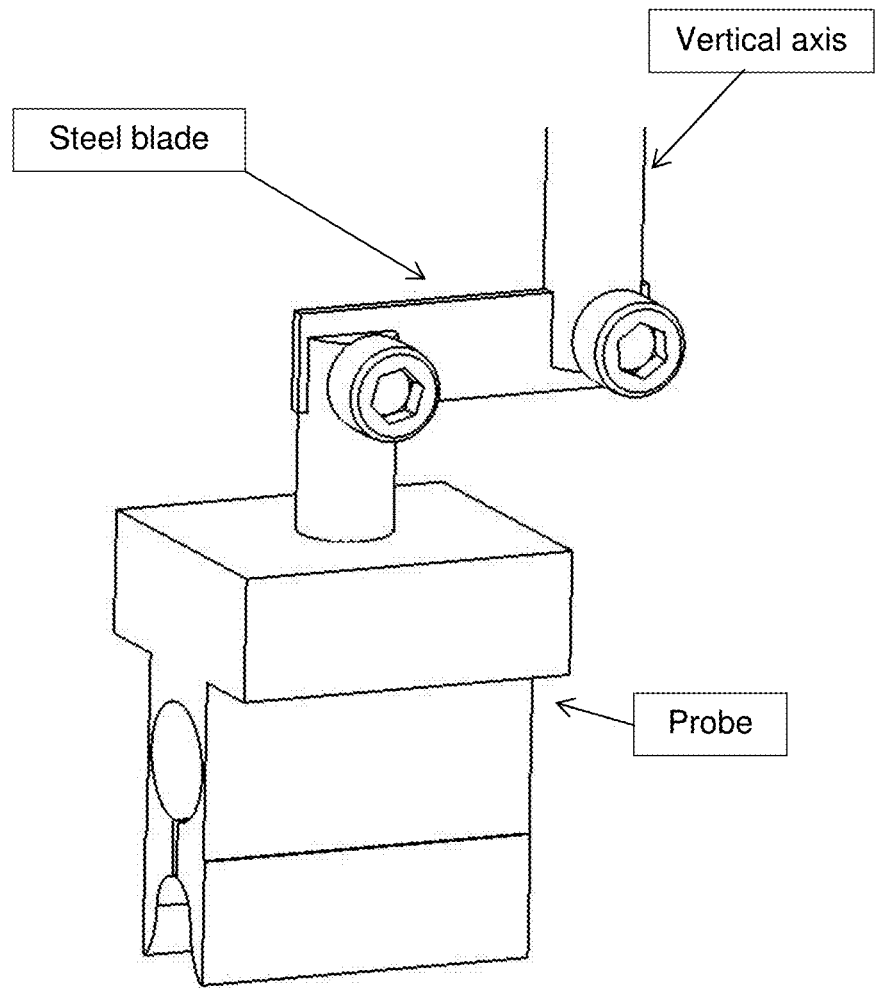
FIG. 16 depicts an actual prospective picture of flexible probe mounting on tuner axis.

A probe holder in form of a thin steel blade (FIGS. 13, 14, 16) performs this task. Typical thickness of the steel blade 42 range between 0.010" and 0.020". The steel blade 42 is inserted in a vertical slot 43 of the tuner axis 44 and tightened against the top stop of the slot using a traversal screw 45. This ensures that the blade 42 will not tilt, even if the probe 46 exercises a vertical pulling force when moved vertically. On the side of the probe the same mounting technique is used: the blade is inserted inside a slot 47 of the probe's holding pin 48 and tightened against the bottom of this slot 49 using a traversal screw 50.

Figure 1:
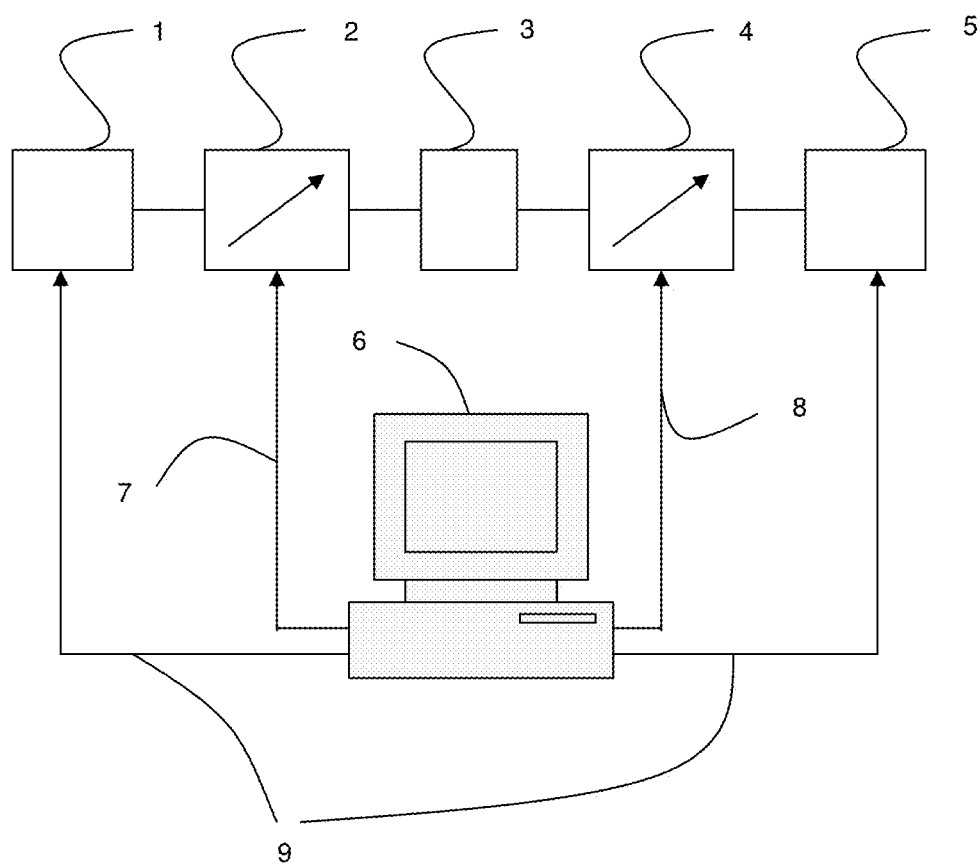
FIG. 1 depicts prior art, a typical automated load pull test setup.
Figure 2:
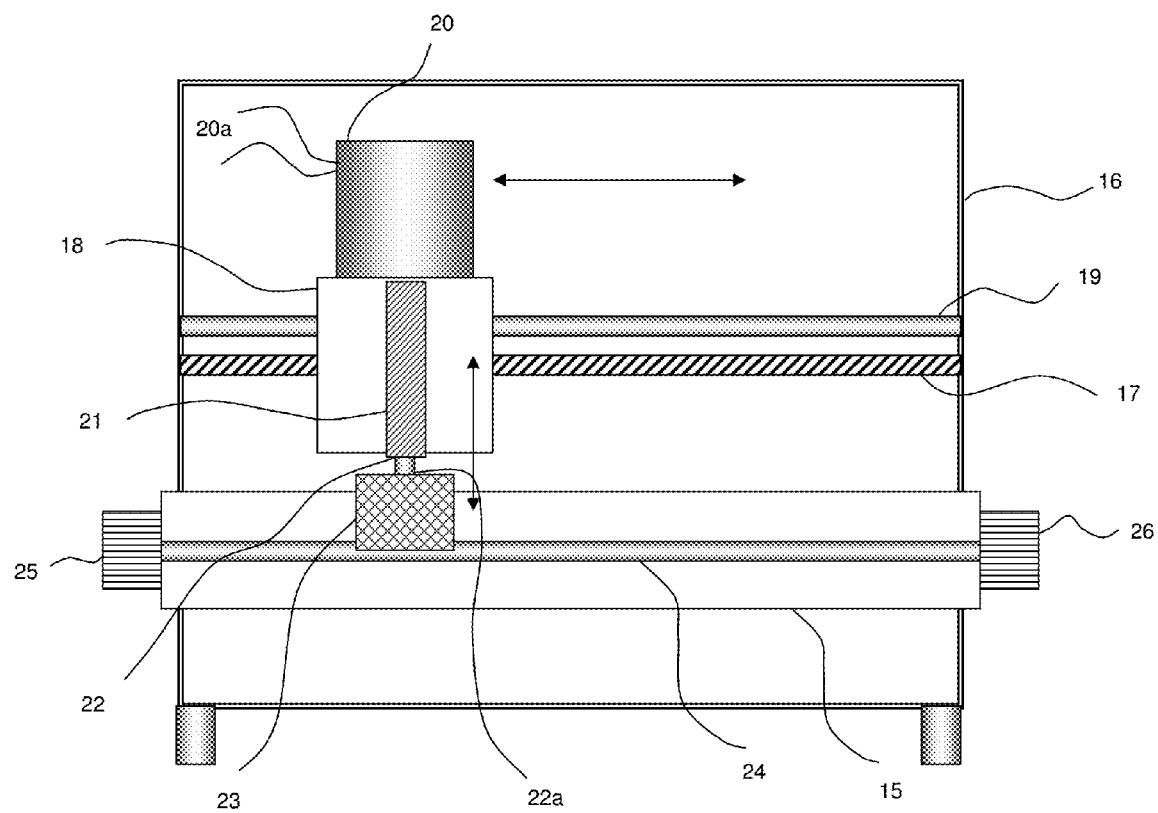
FIG. 2 depicts prior art, a front view and cross section of slide screw tuner with a single vertical axis and probe.
Figure 3:
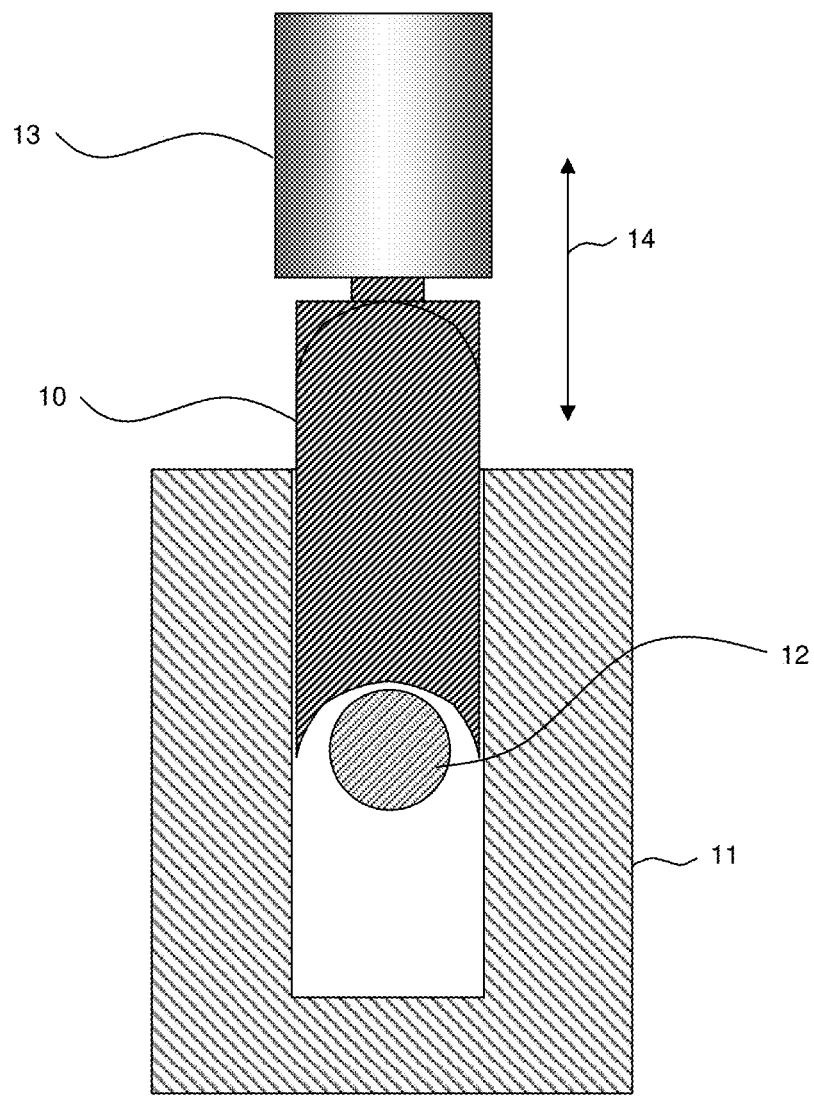
FIG. 3 depicts prior art, a cross section of perfectly aligned slide screw tuner.
Figure 4:
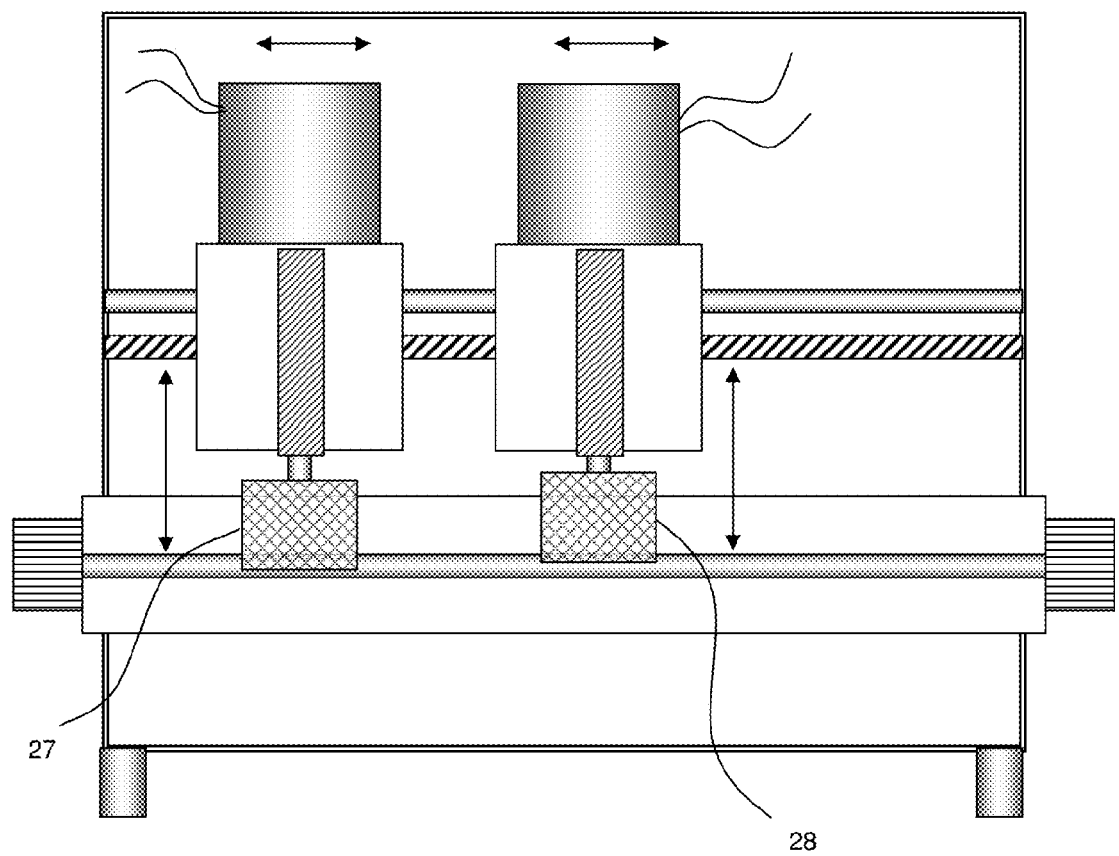
FIG. 4 depicts prior art, a front view and cross section of slide screw tuner with two independent probes and vertical axis.
Figure 5:
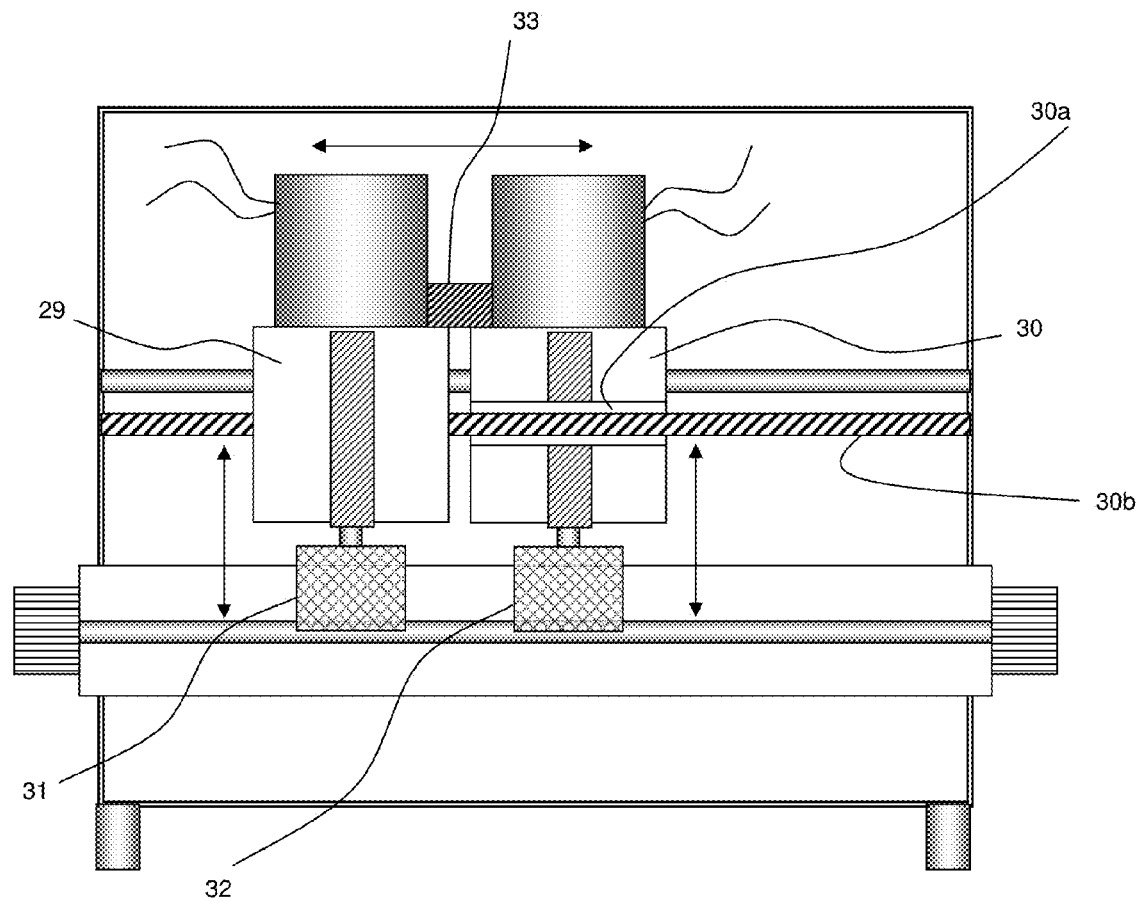
FIG. 5 depicts prior art, a front view and cross section of slide screw tuner with two linked and synchronous vertical axis and probes.
Figure 6:
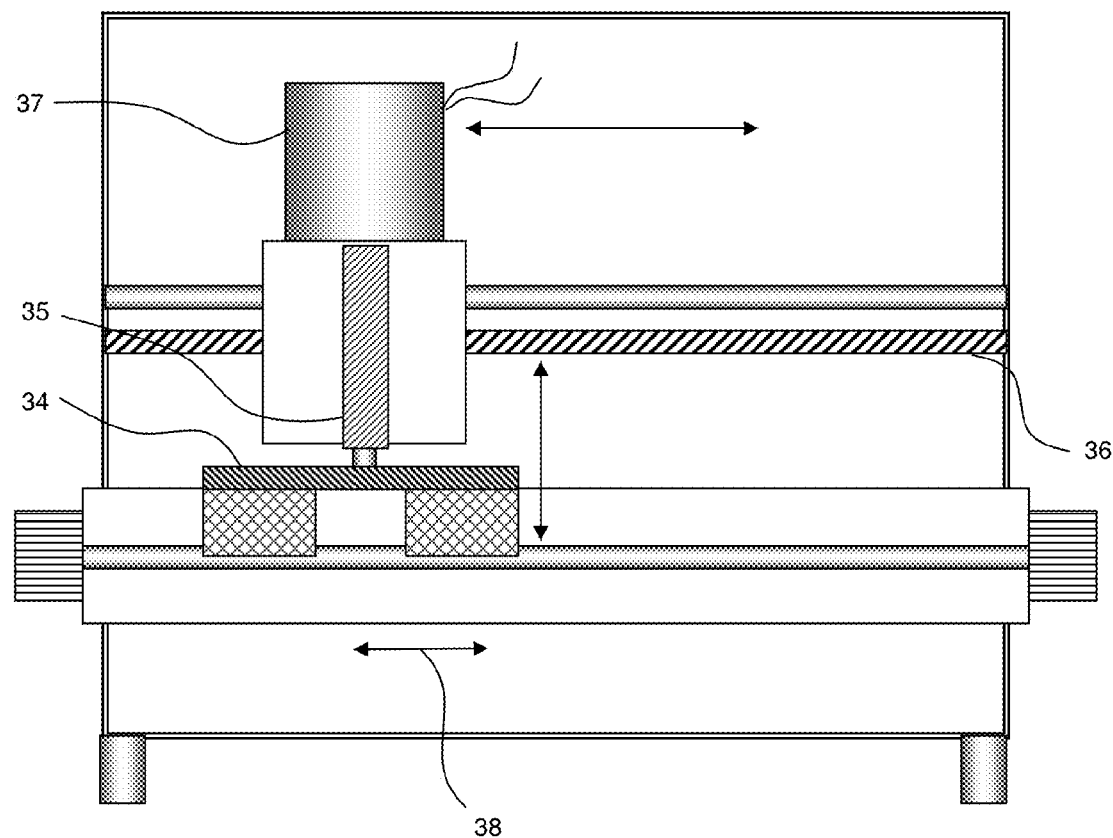
FIG. 6 depicts prior art, a front view and cross section of slide screw tuner with a single vertical axis and double probe.

This mounting technique allows the probe itself 51 to deviate slightly sidewise 52, 53 in order to follow seamlessly the channel of the slabline (FIG. 3). At the same time the probe body can be moved vertically without tilting. It can also be moved horizontally without any measurable backlash.

Figure 15:
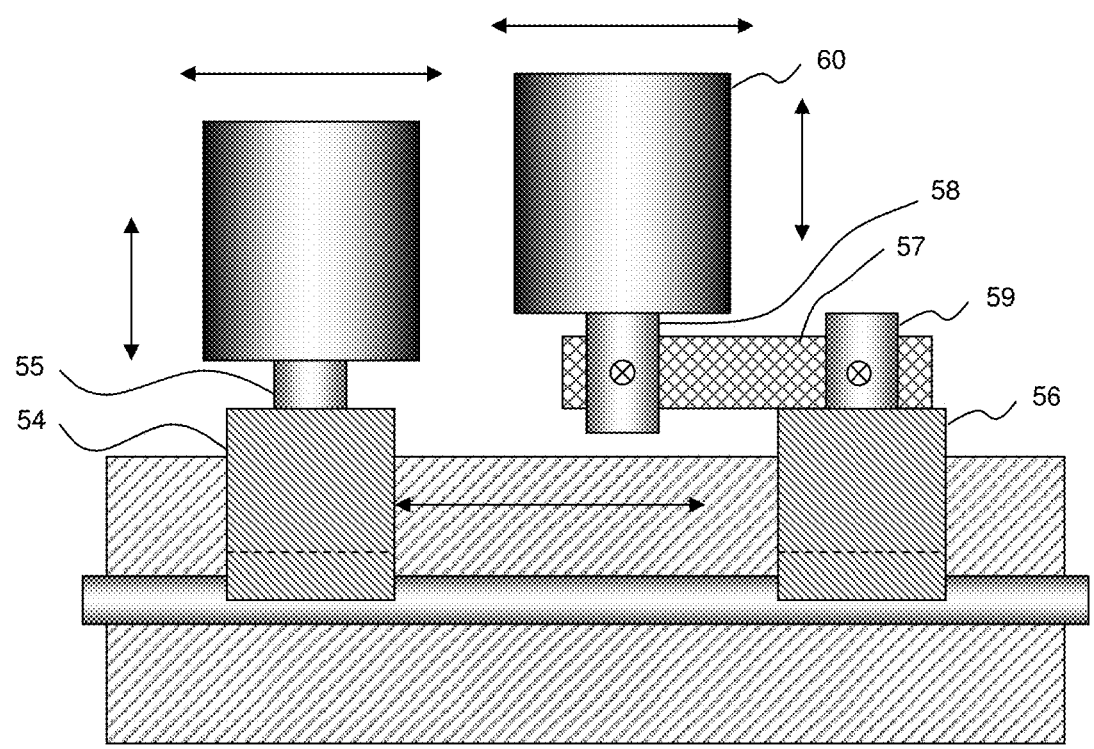
FIG. 15 depicts a side view section of two probe tuner, one with fixed mounting and one with flexible mounting.

If the tuner axis is misaligned (FIG. 9) the steel blade allows the probe to tilt 52, but without losing vertical or horizontal positioning accuracy, since the blade 42 cannot bend vertically, The flexible joint between vertical axis and RF probe works for single probe tuners as well as for multiple probe tuners. In case of a single probe tuner alignment becomes even easier to carry through. A setup for a two probe tuner is shown in FIG. 15. In this case the first probe 54 is hold in place by a non-flexible joint 55, whereas the second probe 56 is mounted using a flexible joint made of a steel blade 57 firmly attached to the tuner axis 58 and the probe holding pin 59. In this case the alignment of the first probe 54 is still critical, whereas the second probe 56 is self aligning when the carriage holding the axis 60 moves horizontally or the axis 60 moves vertically.

Figure 17:
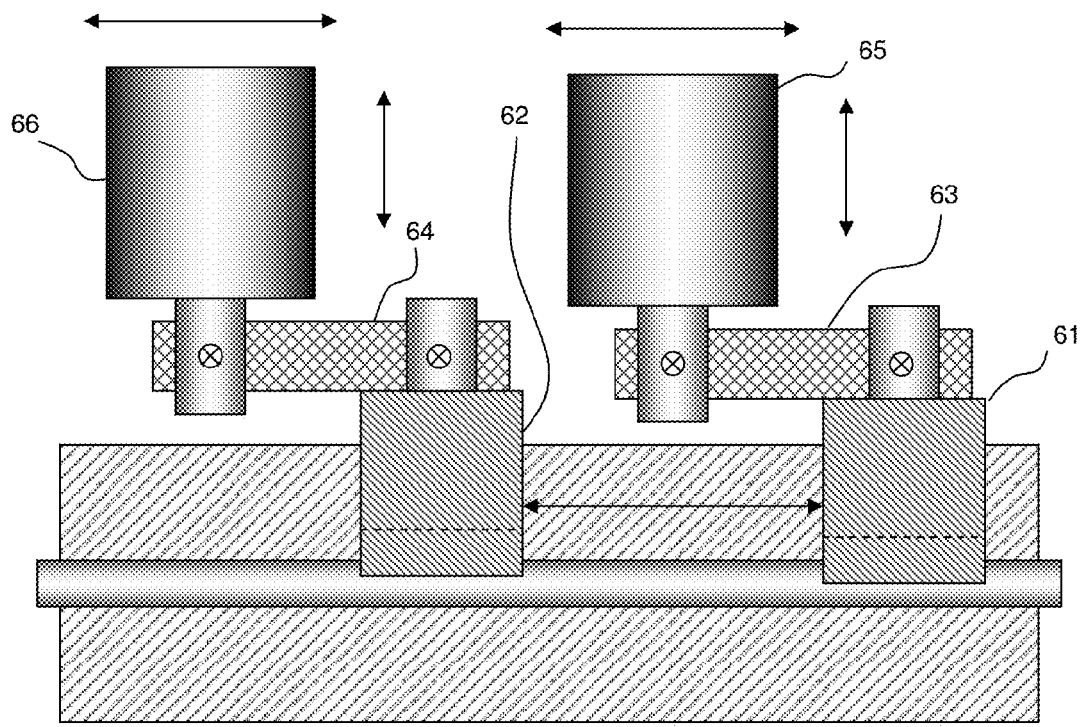
FIG. 17 depicts a side view section of two probe tuner, where both probes are mounted using flexible steel blade joints.

FIG. 17 shows a two probe tuner structure, where both probes 61 and 62 are mounted using flexible steel blade joints 63, 64 to the corresponding vertical axis 65, 66. This tuner configuration is the simplest one to align; in fact it is mostly "self-aligning".

Figure 18:
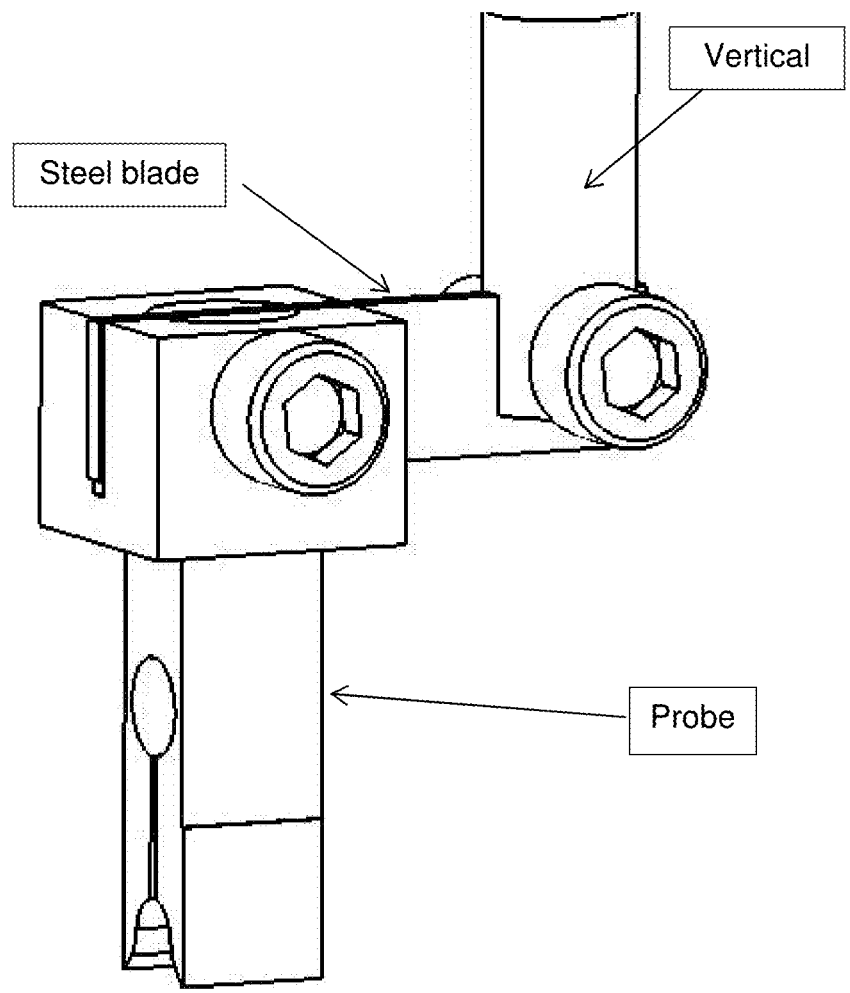
FIG. 18 depicts an actual picture of RF probe mounted in a slide screw tuner slabline and hold with flexible steel blade.

FIG. 18 shows an actual perspective view of a tuner probe mounted using a flexible steel blade joint into a narrow (millimeter wave frequency) channel of a slabline.

FIG. 19 shows a side view of a double probe tuner using a single vertical axis 67 on which two identical probes 68 and 69 are mounted on the vertical tuner axis 67 using a central holding pin 73 and a single two-sided flexible steel blade joint 70. In this case both probes move simultaneously in horizontal and vertical direction, but each one can adjust to the possible imperfections of the slabline channel 71, even when they are very close to the central conductor 72.

Figure 7:
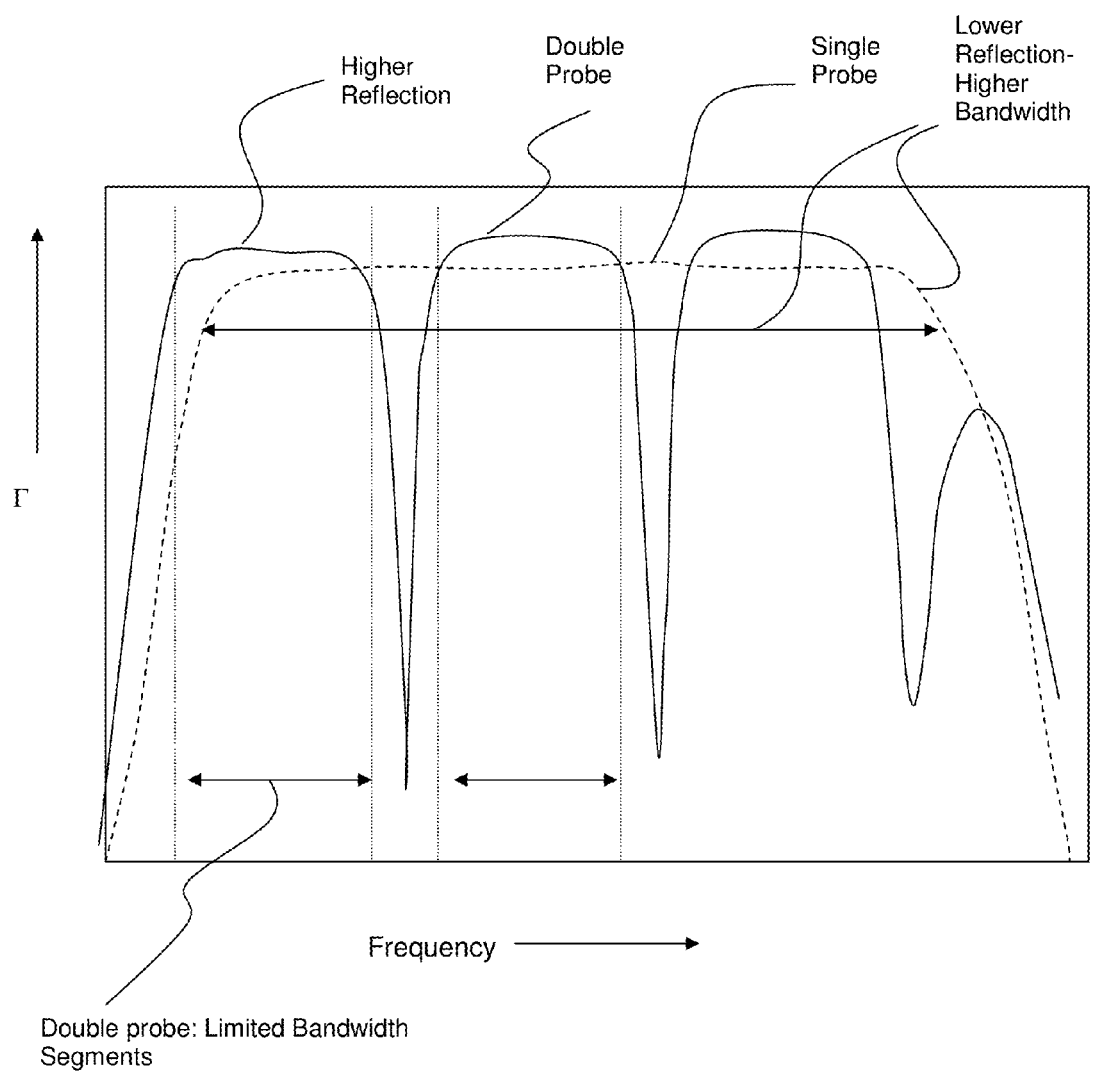
FIG. 7 depicts prior art, a frequency response of single probe and ideally aligned double probe tuners.
Figure 8:
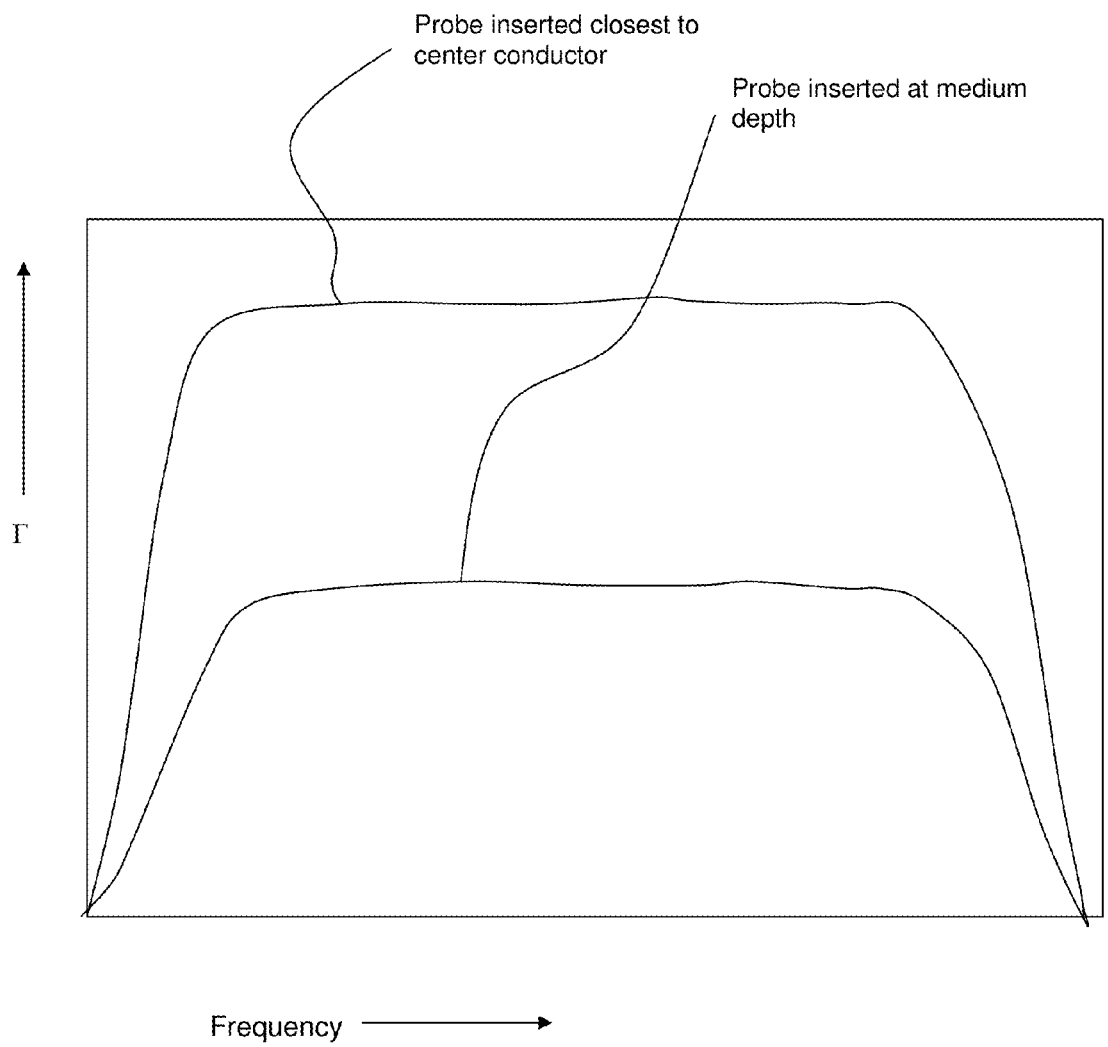
FIG. 8 depicts prior art, a frequency response of load pull tuner using optimally aligned single probe.

In a further configuration (FIG. 20) a tuner with a double probe carries a flexible steel blade joint 74 which has more than two lateral holes at various distances 75, 76, 77, which allow the two probes 78, 79 to be mounted at adjustable distances from each other 86. This allows changing the operational frequency band of the tuner (FIG. 7) and shifting it at will into an area of interest for the user. This adjustment must be done manually. This is the disadvantage of this type of double probe tuner.

In an alternative configuration (FIG. 21) a double probe tuner is shown, which comprises two different probes, one for high frequencies 80 and one for low frequencies 81, both being mounted on a single flexible steel blade joint 82, which has also extra holes 83, 84 for being able to be used at different frequency bands by changing the horizontal space 85 between probes.

In some cases a static probe adjustment is sufficient. FIG. 22 shows such an arrangement. It comprises an intermediate cylinder 86, 94 between the tuner axis 87 and the probe 88. Said intermediate ring has two vertical slots 89, 90 slots, which allow it to rotate 97 inside the tuner axis 87 and fastened around the probe holding pin 91 using an ordinary collar 92 and fastening screw 93. The important feature of this intermediate cylinder shown as item 86 (in FIG. 23a) and 94 (in FIG. 23b) is that its central hole is placed eccentrically relative to its outside periphery. This way, by rotating this intermediate cylinder 94 as shown by the arrow 97 an operator can move the probe 88 laterally, as shown by the arrow 95, and compensate for a misalignment of the tuner axis 87 relative to the slabline 96. This technique, however, allows for a static compensation for a tuner misalignment, whereas the techniques described in FIGS. 14-21 allow for a dynamic compensation during probe movement inside the slabline.

The scope of the invention as defined in the appended claims is directed, singly or in combination, to a load pull tuner using one, two or more independent or linked probes and two techniques for alignment: a dynamic, self aligning flexible technique and an operator adjustable static mounting mechanism between the vertical axis of the tuner and the probe(s). The self aligning technique makes exact adjustment of the probe(s) inside a real slabline, tuner axis and probes manufactured and assembled using realistic tolerances possible during tuner operation and movement, whereas the static adjustment technique allows for compensation mainly of assembly tolerances.

The techniques described here apply in particular to tuners using three probes, such as the multi-probe multi-purpose tuners [6]. In this case it is practically almost impossible to align three RF probes simultaneously inside the same slabline to the required accuracy, because of previous discussed manufacturing misalignments. A self-aligning technique or at least a technique allowing individual lateral adjustment of each RF probe, as described here, are of essence.

Although the present invention has been explained hereinabove by way of a preferred embodiment thereof, it should be pointed out that other combinations of the described components are possible and, as far as obvious to a person skilled in the art, they shall not limit the scope of the present invention.

The invention claimed is:

1. An auto aligning method for maximizing the reflection factor in single-carriage slide-screw impedance tuner at a user defined frequency of operation using adjustable tuning device said tuner having a test port and an idle port and a slotted airline (slabline) between the ports, and one mobile carriage moving horizontally along the axis of the slabline, said carriage comprising a vertical axis holding the tuning device, whereby said tuning device creates reflection factor when sliding into the slot of the slabline;

said tuning device being inserted vertically into the slot and moved parallel to the axis of the slabline;

wherein the tuning device is a probe assembly comprising two individual metallic probes (slugs), probe 1 and probe 2, which are attached to the vertical axis using a flexible vertical steel blade, hereby allowing sideways (lateral) self-alignment inside the slot of the slabline, and are manually configurable at adjustable horizontal distance (gap) between them;

and whereby the gap is adjusted for the reflection factor vectors, created at the selected frequency by probes 1 and 2, to have an angle of approximately zero degrees between them.

2. A tuner as in claim 1, whereby the optimum frequency of operation is determined by mounting the probes 1 and 2 at a fixed horizontal distance (gap) between them.

3. A probe assembly as in claim 1, whereby probes 1 and 2 have approximately the same size in horizontal direction.

4. A probe assembly as in claim 1, whereby probes 1 and 2 have different sizes in horizontal direction, allowing optimization of the frequency.

5. A tuning device as in claim 1, whereby the probes are attached to the vertical steel blade using traversal screws, inserted in pre-existing holes in the blade.

* * * * *